US006324083B1

(12) United States Patent
Thus et al.

(10) Patent No.: US 6,324,083 B1
(45) Date of Patent: Nov. 27, 2001

(54) METHOD OF AND ARRANGEMENT FOR CONVERTING VOLTAGE TO CURRENT

(75) Inventors: Franciscus Johannes Maria Thus; Henk Derks, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/624,525

(22) Filed: Jul. 24, 2000

(30) Foreign Application Priority Data

Jul. 28, 1999 (EP) .................................................. 99202478

(51) Int. Cl.$^7$ ............................ H02M 7/00; H02M 11/00
(52) U.S. Cl. ............................................... 363/73; 327/103
(58) Field of Search ............................... 363/73; 323/312, 323/313, 315; 327/103, 535, 538

(56) References Cited

U.S. PATENT DOCUMENTS

| | | | |
|---|---|---|---|
| 4,100,433 | * | 7/1978 | Duffy et al. .......................... 307/229 |
| 5,463,309 | * | 10/1995 | Kawano ................................ 323/315 |
| 5,815,012 | * | 9/1998 | Rivoir et al. ......................... 327/103 |

OTHER PUBLICATIONS

"A 27MHz Programmable Bipolar 0.05 Equiripple Linear–Phase Lowpass Filter", by Geert A. De Veirman et al., IEEE International Solid–State Circuits Conference 1992, pp. 64,65, 244.

* cited by examiner

Primary Examiner—Matthew Nguyen
(74) Attorney, Agent, or Firm—Steven R. Biren

(57) ABSTRACT

An arrangement (1) for converting voltage ($V_{in}$) into current ($I_{out}$), implemented on a chip (100), comprises a first V/I converter (3), the operation of which is based on a conversion resistor ($R_{conv}$) formed on the chip. This resistor has an unknown fabrication tolerance ($\alpha$). This is compensated for by the presence of a second V/I converter (13) having a compensation resistor ($R_{comp}$), which is also formed on the chip and which has the same fabrication tolerance ($\alpha$). Furthermore, a third V/I converter (23) is present, which operates on the basis of an external resistor ($R_{ref}$). The second V/I converter (13) converts a reference voltage ($V_{ref}$) into a compensation current signal ($I_{comp}$), and the third V/I converter (23) converts the reference voltage ($V_{ref}$) into a reference current signal ($I_{ref}$). The output current ($I_{out}$) is provided by multiplying an output current signal ($I_1$) of the first V/I converter (3) by a factor which is proportional to the reference current signal ($I_{ref}$) and which is inversely proportional to the compensation current signal ($I_{comp}$).

16 Claims, 5 Drawing Sheets

METHOD OF AND ARRANGEMENT FOR CONVERTING VOLTAGE TO CURRENT

BACKGROUND OF THE INVENTION

The present invention relates to a method of and an arrangement for converting a first electrical quantity to a second electrical quantity. The present invention particularly relates to the conversion of voltage to current and more specifically to a voltage/current converter implemented in a chip.

Such converters are generally known. Generally speaking, converters may be divided into two different types, such as for example a type in which the conversion is based on a transconductance, or a type in which the conversion is based on an electrical resistance. A converter of the first-mentioned type is described, for example, by Geert A. de Veirman and Richard G. Yamasaki in 1992 IEEE International Solid State Circuits Conference, ISSCC92/Session 4/Signal processing/Paper WP4.2/"27 MHz Programmable Bipolar 0.05° Equiripple Linear-Phase Lowpass Filter". However, a drawback of a transconductance is its comparatively low linearity.

SUMMARY OF THE INVENTION

It is an object of the invention to provide a converter with a linearity better than the linearity of a transconductance-based converter.

Converters of the second type, i.e. in which the conversion is based on an electrical resistance, generally have a better linearity. This means that the variation in output current (dI) in the case of a variation in input voltage (dV) is constant over a satisfactorily wide range. Hereinafter, a conversion coefficient $\lambda$ will be defined as $\lambda=dI/dV$. It is desirable to be able to fabricate a converter in such a manner that the conversion coefficient $\lambda$ is precisely known in advance. In general, this conversion coefficient $\lambda$ depends on the resistance value of a conversion resistor. If a correction converter is constructed from discrete components a conversion resistor may be selected whose resistance value corresponds to a desired conversion resistance value. However, if the converter forms part of an on-chip circuit, where the conversion resistor is integrated on this chip, it is very difficult to ensure that the resistance value of the conversion resistor accurately corresponds to the resistance value required for the conversion. The deviation which generally occurs and which is caused by variations in process conditions during the fabrication of the chip, will also be termed "tolerance" $\alpha$. It is to be noted that this tolerance may have a considerable value, which is not known in advance and generally differs from wafer to wafer. On-chip integrated resistors may specifically have a tolerance of 30%.

Therefore, it is an object of the present invention to provide compensation for such a tolerance.

The invention is based on the insight that if a plurality of resistors are fabricated on a chip all these resistors will be fabricated by means of the same process steps and therefore all these resistors will have substantially the same inaccuracy or tolerance.

On the basis of this insight the present invention provides a converter having a conversion resistor and a compensation resistor, said conversion resistor and said compensation resistor being formed in the same process steps.

The invention further provides a chip including a plurality of converters which each have an associated conversion resistor and which have a single compensation resistor common to all said converters, all said conversion resistors and the compensation resistor being formed in the same process steps.

In accordance with a further important aspect of the present invention an accurate reference current is provided on a chip, which reference current is based on, for example, an external reference resistor, and a current derived from said accurate reference current is supplied as output current of a V/I converter, the ratio between the output current and the reference current being defined by the ratio between, on the one hand, a current determined by a conversion resistor and, on the other hand, by the current determined by the compensation resistor.

BRIEF DESCRIPTION OF THE DRAWING

These as well as further aspects, features and advantages of the present invention will be elucidated by means of the following description of an embodiment, given by way of example, with reference to the drawings, in which.

DESCRIPTION OF THE PREFERRED EMBODIMENTS

The operating principle of the present invention will now be explained with reference to the functionally intended block diagram of FIG. 1. A resistor will be referred by a letter, for example R, the actual resistance value of this resistor will be referred by its reference symbol in square brackets, for example [R], and the intended or desired resistance value of this resistor, also referred to as "rated resistance", will be referred to by its reference symbol with a suffixed asterisk in square brackets, for example [R*].

Figure 1:
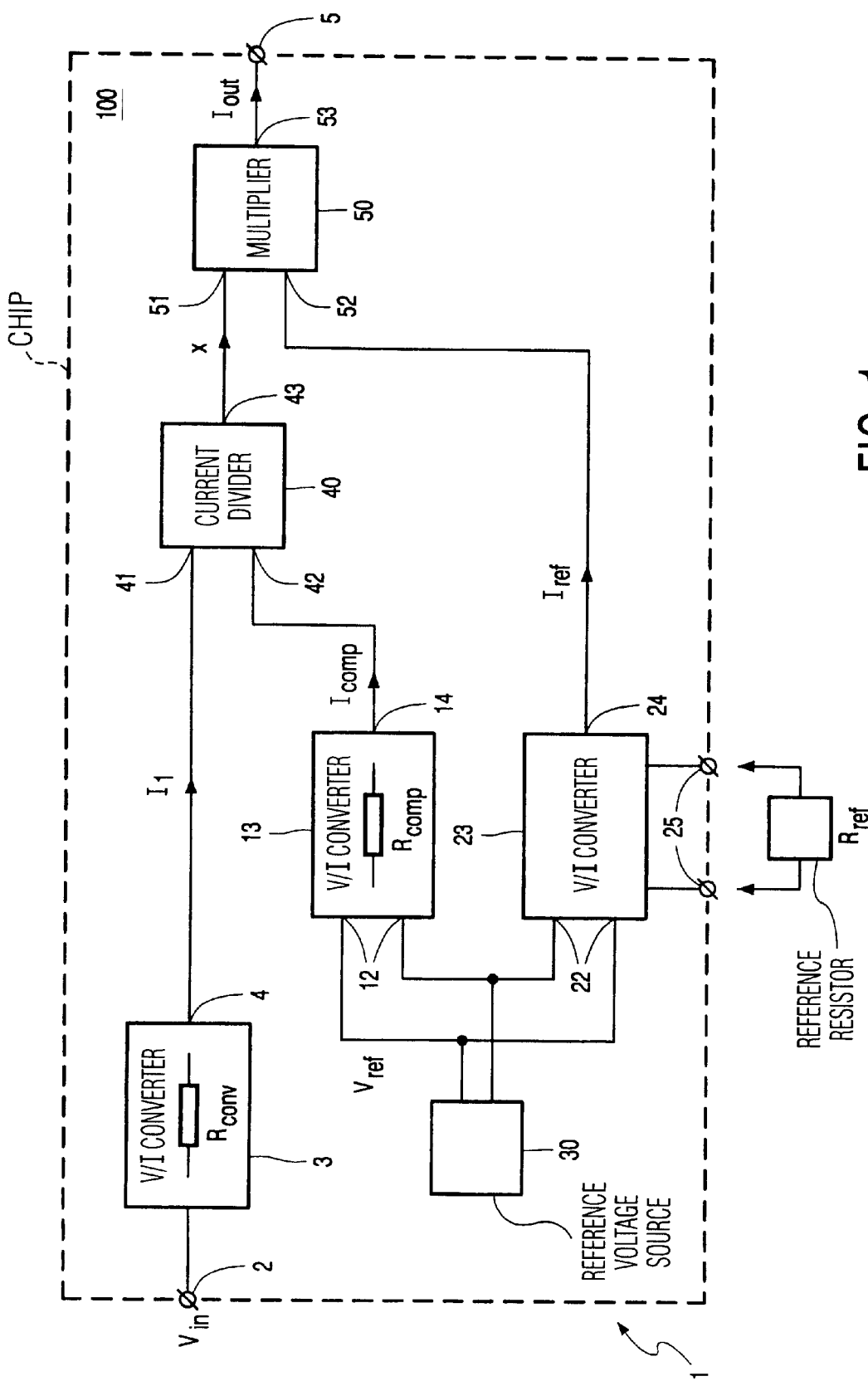
FIG. 1 is a functional block diagram which illustrates the operating principle of the present invention.

FIG. 1 shows a V/I converter arrangement in which the present invention is embodied and which bears the general reference numeral 1. This V/I converter arrangement 1 is realized on a chip 100 and may form part of a more extensive circuit arrangement fabricated on the chip 100.

The V/I converter arrangement 1 has a signal input 2 for receiving an input voltage $V_{in}$, and a signal output 5 for supplying an output current $I_{out}$. Assume that it is desired that the conversion factor $dI_{out}/dV_{in}$ of the V/I converter arrangement is equal to a predetermined value $\lambda^*$ to a satisfactory degree.

The input signal $V_{in}$ is applied to a first V/I converter 3 which supplies a current output signal $I_1$ at its output 4. The conversion from voltage to current through the first V/I converter 3 is based on a conversion resistor $R_{conv}$. The first V/I converter 3 has been designed for a high degree of linearity, with a conversion factor $\lambda_1$ ($\lambda_1=dI_1/dV_{in}$) equal to $1/[R_{conv}]$. It is to be noted that, with a slight adaptation, the following explanation also applies to a converter for which the conversion factor is not equal to but, for an arbitrary constant proportionality factor, proportional to the reciprocal of the resistance value of the conversion resistor, as will be evident to one skilled in the art.

During the design of the first converter 3 the resistor $R_{conv}$ is designed in such a manner that its rated resistance $[R_{conv}^*]$ is equal to $1/\lambda^*$. However, in reality the resistor $R_{conv}$ will have an actual resistance value $[R_{conv}]$ which deviates from its rated resistance $[R_{conv}*]$ in accordance with the formula $[R_{conv}]=\alpha[R_{conv}*]$. Consequently, the actual value $\lambda_{-1}$ of the conversion factor deviates from the rated value $\lambda*$ in accordance with the formula $\lambda_{-1}1=/\alpha[R_{conv}*]=\lambda*/\alpha$. Herein, $\alpha$ is a factor whose magnitude is not known in advance. The value of a which occurs in practice appears to be dependent on the actual process conditions during the fabrication of the conversion resistor on the chip.

In accordance with an aspect of the present invention the chip 100 includes a second V/I converter 13 having a voltage input 12 and a current output 14, the operation of this converter being based on a second resistor termed compensation resistor $R_{comp}$. This compensation resistor $R_{comp}$ has a rated resistance value $[R_{comp}*]$. It is important that the compensation resistor $R_{comp}$ on the chip 100 is manufactured in the same process steps as the conversion resistor $R_{conv}$, as a result of which the compensation resistor $R_{comp}$ has the same characteristics as the conversion resistor $R_{conv}$; specifically, the actual resistance value $[R_{comp}]$ of the compensation resistor $R_{comp}$ complies with $[R_{comp}]=\alpha[R_{comp}*]$.

A reference voltage $V_{ref}$ is applied to the voltage input 12 of the second V/I converter 13. This reference voltage $V_{ref}$ can be generated in a manner known per se on the chip 100 itself; FIG. 1 shows diagrammatically that the chip 100 includes a reference voltage source 30 for this purpose. In a manner similar to that set forth hereinbefore for the first V/I converter 3 the second V/I converter 13 supplies an output current $I_{comp}$ via its output 14, which output current is dependent on the reference voltage $V_{ref}$ in accordance with the formula $$I_{comp}=V_{ref}/(\alpha[R_{comp}*]).$$

In accordance with a further aspect of the present invention the chip 100 includes a third V/I converter 23 having a voltage input 22 and a current output 24, the operation of this third V/I converter being based on a reference resistor $R_{ref}$ whose resistance value $[R_{ref}]$ is exactly known. This reference resistor $R_{ref}$ does not form part of the chip 100 but is an external resistor, as a result of which the resistance value $[R_{ref}]$ can be determined accurately in advance. For the connection of the external reference resistor $R_{ref}$ two resistor input terminals 25 are shown for the third V/I converter 23 shown in FIG. 1; in practice, it is obviously also possible that the third V/I converter 23 has only one resistor input terminal 25, in which case the external reference resistor $R_{ref}$ is connected between said one terminal 25 and ground.

A second reference voltage is applied to the voltage input 22 of the second V/I converter 23. This second reference voltage can be generated in a manner known per se on the chip 100 itself, similarly to the first reference voltage. In the example shown in FIG. 1 the second reference voltage is equal to said first reference voltage $V_{ref}$ applied to the second V/I converter 13. As will be evident from the following explanation to one skilled in the art, it suffices if the second reference voltage is proportional to said reference voltage $V_{ref}$; the following explanation then requires only some minor adaptations which will be obvious to one skilled in the art. In a manner similar to that set forth hereinbefore in relation to the first converter 3, the third V/I converter 23 supplies an output current $I_{ref}$ via its output 24, which output current depends on the reference voltage $V_{ref}$ in accordance with the formula $$I_{ref}=V_{ref}/[R_{ref}].$$

The V/I converter arrangement 1 further includes a current divider 40 and a multiplier 50. The current divider 40 has a first input 41 connected to the output 4 of the first V/I converter 3 so as to receive the output current $I_1$ thereof, and has a second input 42 connected to the output 14 of the second V/I converter 13 so as to receive the output current $I_{comp}$ thereof. The current divider 40 is adapted to supply at its output 43 a signal X which is indicative of the quotient $I_1/I_{comp}$.

The multiplier 50 has a first input 51 connected to the output 43 of the current divider 40 so as to receive said signal X, and has a second input 52 connected to the output 24 of the third V/I converter 23 so as to receive the output current $I_{ref}$ thereof. The multiplier 50 is adapted to supply at its output 53 an output current Iout which is indicative of the product of X and $I_{ref}$, which output 53 is connected to the output 5 of the V/I converter arrangement 1.

It will be evident, though, that alternatively the sequence of the multiplier 50 and the divider 40 may be reversed. It is also possible that use is made of a combined divider/multiplier element having three inputs for $I_1$, $I_{comp}$ and $I_{ref}$, and which is adapted to supply at its output an output current Iout which is equal to $(I_{ref}I_1)/I_{comp}$. In all cases the inaccurate output signal $I_1$ of the first converter 3 is in fact multiplied by an adaptive correction factor $\gamma=I_{ref}/I_{comp}$, which is a measure of the inaccuracy of the first converter 3.

Thus, the output current Iout complies with:

$$I_{out}=I_{ref}\times I_1/I_{comp}==V_{ref}[R_{ref}]\times V_{in}/\alpha[R_{conv}*]\times\alpha[R_{comp}*]/V_{ref}==V_{in}/[R_{conv}*]\times[R_{comp}*]/[R_{ref}] \quad (1)$$

From formula (1) it is apparent that the output current $I_{out}$ of the converter 1 is independent of the inaccuracy factor $\alpha$. Furthermore, it is apparent from formula (1) that the exact value of the reference voltage $V_{ref}$ has no influence on the output current $I_{out}$. This implies that the reference voltage $V_{ref}$ need not have an accurately known value and even that the reference voltage $V_{ref}$ need not be exactly constant as a function of time.

Moreover, it is to be noted that if $[R_{ref}]$ is selected to be equal to the predetermined rated value $[R_{comp}*]$ of the compensation resistor the conversion coefficient $\alpha$ of the V/I converter arrangement 1 is equal to the rated conversion coefficient $\lambda_{-1}$ of the first converter 3. On the other hand, it may be desirable to have a voltage/current converter with a variable or adjustable conversion coefficient $\lambda$. In accordance with the present invention this can be achieved in various manners. For example, the external reference resistor $R_{ref}$ can be a variable or adjustable resistor. If the rated resistance values $[R_{conv}*]$ and $[R_{comp}*]$ are then selected to be equal to one another, the conversion coefficient $\lambda$ will be equal to the reciprocal of $R_{ref}$. However, it is alternatively possible to provide the V/I converter arrangement 1 in accordance with the invention with a plurality of compensation resistors $R_{comp}$, one or more of which can be selected by means of controllable switches. The controllable switches can be controlled, for example, via a control input such as, for example, a serial bus. It is then possible to set the conversion coefficient $\lambda$ to a plurality of accurate values which are known in advance by means of an external control signal, the necessary selection switches and selection compensation resistors being provided on the chip, without the signal path including any switches which may cause signal distortion.

Figure 2A:
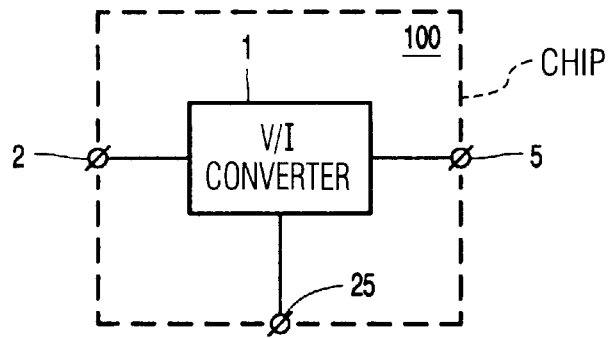
FIGS. 2A–C are function block diagrams.
Figure 2B:
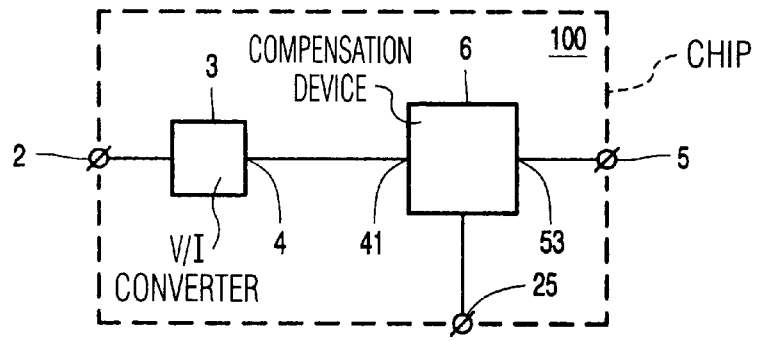

The example of an on-chip V/I converter arrangement 1 in accordance with the present invention having fabrication-tolerance compensation and functionally illustrated in FIG. 1 can be looked upon in different ways. FIG. 2A illustrates that it is simply possible to consider the V/I converter arrangement 1 as an entity having a voltage input 2, a current output 5, and a terminal 25 for an external resistor. The compensation is then incorporated in the V/I converter arrangement 1. FIG. 2B illustrates that it is alternatively possible to regard the V/I converter 3 as a voltage/current converter having a voltage input 2 and a current output 4, and to define a compensation device 6 having an input 41 and an output 53, as well as a terminal 25 for an external resistor. The compensation device 6 then comprises the combination of the parts 13, 23, 30, 40, 50 described above, as will be evident to one skilled in the art. Hereinafter, the V/I converter 3, which converts the input signal $V_{in}$ into a current signal $I_1$, will also be termed a primary converter.

Figure 2C:
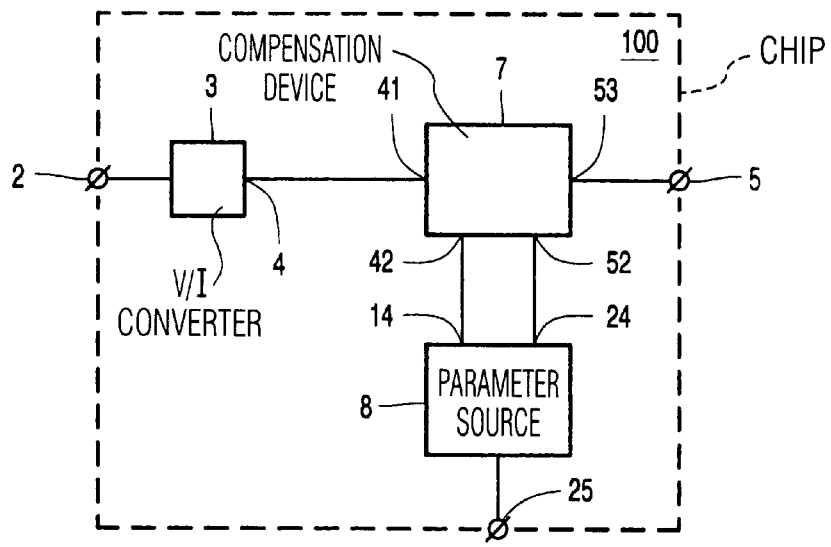

FIG. 2C illustrates that it is also possible to define for the primary converter 3 a compensation device 7 having an input 41 and an output 53, and input terminals 42 and 52 for receiving compensation parameters $I_{comp}$ and $I_{ref}$. The compensation device 7 then comprises the combination of the parts 40 and 50 described above, as will be evident to one skilled in the art. The compensation parameters $I_{comp}$ and $I_{ref}$ are then supplied by a parameter source 8 having outputs 14 and 24 and having a terminal 25 for an external resistor. The parameter source 8 then comprises the combination of the parts 13, 23, 30 described above, as will be evident to one skilled in the art.

Figure 3:
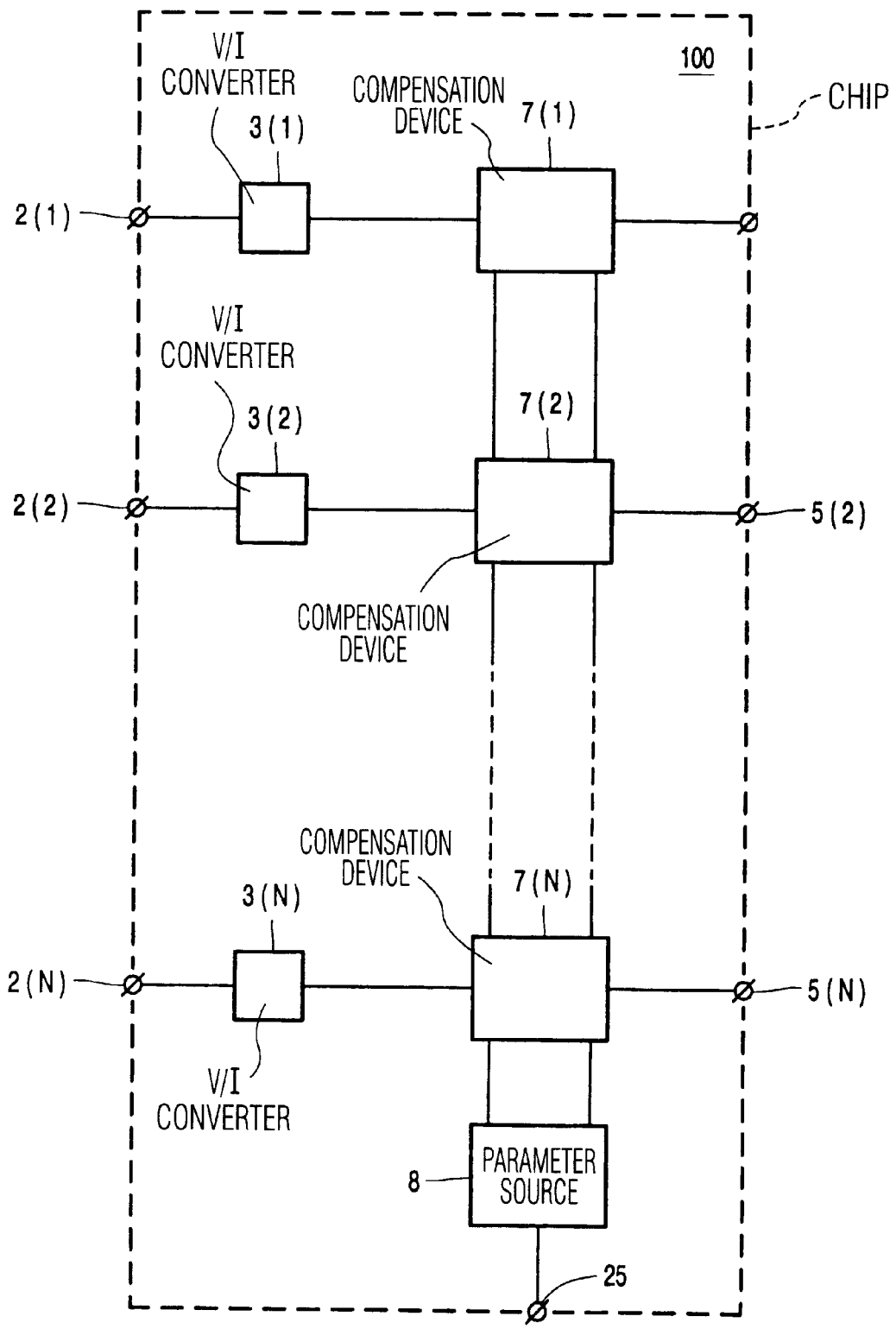
FIG. 3 is a function block diagram, comparable to that of FIG. 2C, for a chip including a plurality of V/I converters.

FIG. 3 illustrates a special version of a chip 100 which includes a plurality of compensated converters in accordance with the present invention. Obviously, it is also possible to realize such a version by the fabrication of a multiplicity of compensated converters 1 as shown in FIG. 1. However, FIG. 3 illustrates, in a representation similar to that in FIG. 2C, that in accordance with an advantageous feature of the present invention a plurality of primary V/I converters 3(1-1N) with associated compensation devices 7(1-N), as well as a single parameter source 8 common to said compensation devices 7(1-N), can be accommodated on the chip 100. More particularly, it is possible to use a single common external reference resistor $R_{ref}$.

Figure 4A:
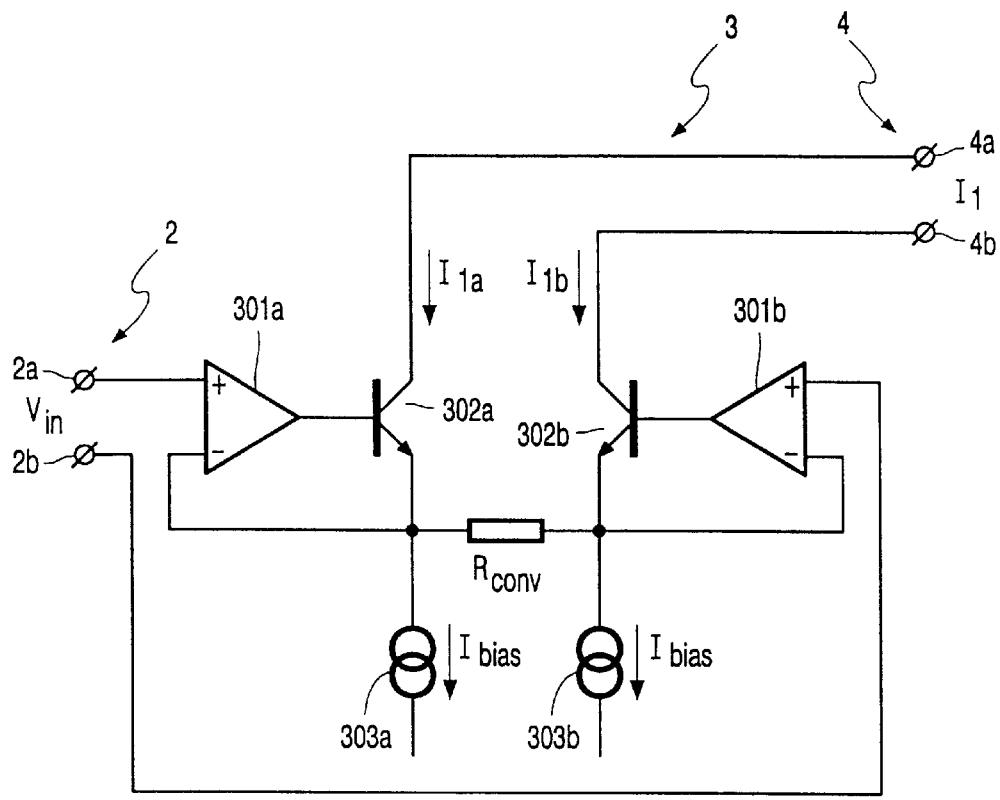
FIGS. 4A–C illustrate an example of a combined V/I converter and a multiplier stage.

FIG. 4A illustrates a practical example of a primary V/I converter 3 in accordance with the present invention. The voltage input 2 is now a symmetrical voltage input having two input terminals 2a and 2b and the current output 4 has two output terminals 4a and 4b, which are connected to the collectors of respective transistors 302a and 302b. The input terminals 2a and 2b are connected to the non-inverting inputs of respective operational amplifiers 301a and 301b, which have their outputs connected to the bases of the respective transistors 302a and 302b. The emitters of the transistors 302a and 302b, which are respectively connected to the inverting inputs of the operational amplifiers 301a and 301b, are connected to respective ends of the conversion resistor $R_{conv}$. This results in a potential difference across the conversion resistor $R_{conv}$, which potential difference is equal to the potential difference across the two input terminals 2a and 2b and is consequently equal to $V_{in}$.

The emitters of the transistors 302a and 302b are connected to respective current sources 303a and 303b, which are each adapted to generate a bias current $I_{bias}$, whose magnitude is non-critical. The potential difference across the conversion resistor $R_{conv}$ produces a current $I_1=V_{in}/R_{conv}$ through the conversion resistor $R_{conv}$. This current should be supplied by the transistors 302a and 302b, as a result of which the difference in the collector currents of the transistors 302a and 302b is equal to $I_1$. Thus, the output signal $I_1$ appearing at the output 4 is a current difference signal; it is not necessary to know the exact values of the currents $I_{1a}$ and $I_{1b}$ flowing in the terminals 4a and 4b.

It is to be noted that alternative versions are possible in which the output current signal $I_1$ is supplied at a single output terminal with respect to ground.

Figure 4B:
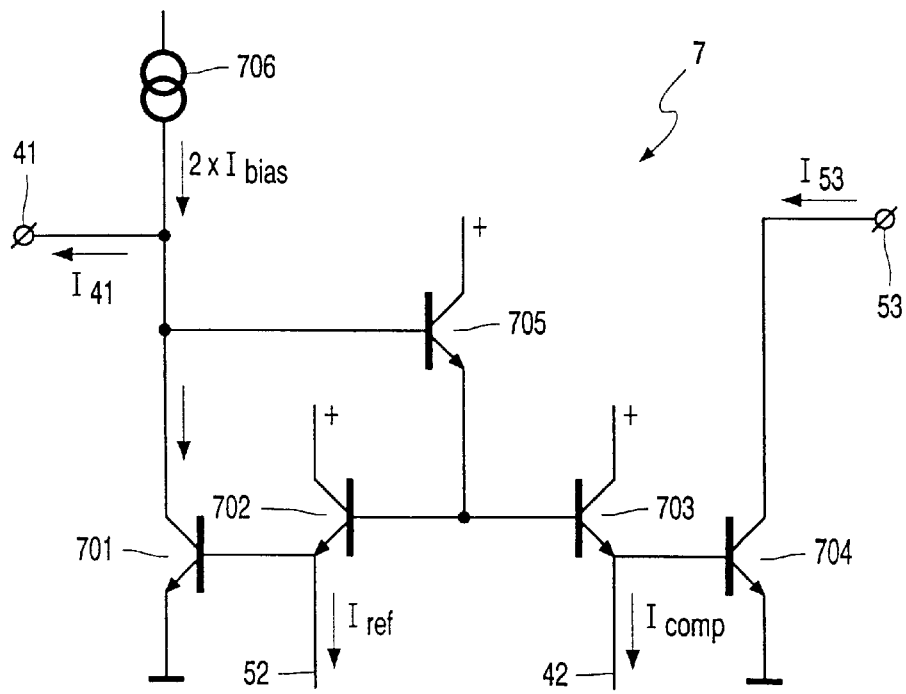

FIG. 4B illustrates a practical example of a compensation device 7 in accordance with the present invention in the interpretation as illustrated in FIG. 2C.

The compensation device 7 in accordance with the present invention shown in FIG. 4B includes five transistors 701 through 705. A first transistor 701 has its collector coupled to the current input 41 for receiving an input current $I_{41}$. The emitter of the first transistor 701 is connected to ground. The first transistor 701 has its base connected to the emitter of a second transistor 702 and to the reference current input 52 for receiving the reference current $I_{ref}$.

The second transistor 702 has its base connected to the base of a third transistor 703, whose emitter is connected to the base of a fourth transistor 704, and to the compensation current input 42 for receiving the compensation current $I_{comp}$. The fourth transistor 704 has its emitter connected to ground.

The bases of the second transistor 702 and the third transistor 703 are connected to the emitter of a fifth transistor 705, which has its base connected to the current input 41. The collectors of the second, the third and the fifth transistor 702, 703 and 705 are connected to a positive supply voltage.

The collector of the fourth transistor 704 is connected to the current output 53 and supplies a current $I_{53}$ which complies with $I_{53}=I_{41}\times(I_{ref}/I_{comp})$.

As stated, FIGS. 4A and 4B show possible practical examples of a primary V/I converter 3 and a compensation device 7. Further practical alternatives are possible and it will be evident to one skilled in the art how these alternatives can be chosen and/or modified so as to enable them to be connected to one another. In order to enable a direct connection of the primary V/I converter 3 of FIG. 4A and the compensation device 7 of FIG. 4B the compensation device 7 in FIG. 4B has an additional current source 706, which is connected to the current input 41 and which supplies a current having a current strength $2*I_{bias}$, as a result of which the current directions of the currents through the output branch of the primary V/I converter 3 of FIG. 4A and through the input branch of the compensation device 7 of FIG. 4B match with one another.

The compensation device 7 in accordance with the present invention shown in FIG. 4B is thus suitable for the compensation of an (absolute) current strength $I_{41}$ received at the input 41 of this device by multiplying it by the desired parameter $I_{ref}/I_{comp}$. This is adequate if this input current $I_{41}$ is equal to $I_1$. If, as in the example illustrated in FIG. 4A, the primary V/I converter 3 supplies its output current $I_1$ as a differential current at two output terminals 4a and 4b, the compensation device 7 shown in FIG. 4B should be provided in duplicate, in which case an input 41a, 41b of each "half" always receives the current $I_{1a}$ or $I_{1b}$ generated at a respective output 4a or 4b of the primary V/I converter 3 and an output 53a, 53b of each "half" always supplies a current $I_{53a}$, $I_{53b}$ multiplied by the desired parameter $I_{ref}/I_{comp}$, as a result of which the significant output signal $I_{out}=I_{53}$ is again a difference signal $(I_{53a}-I_{53b})$.

Figure 4C:
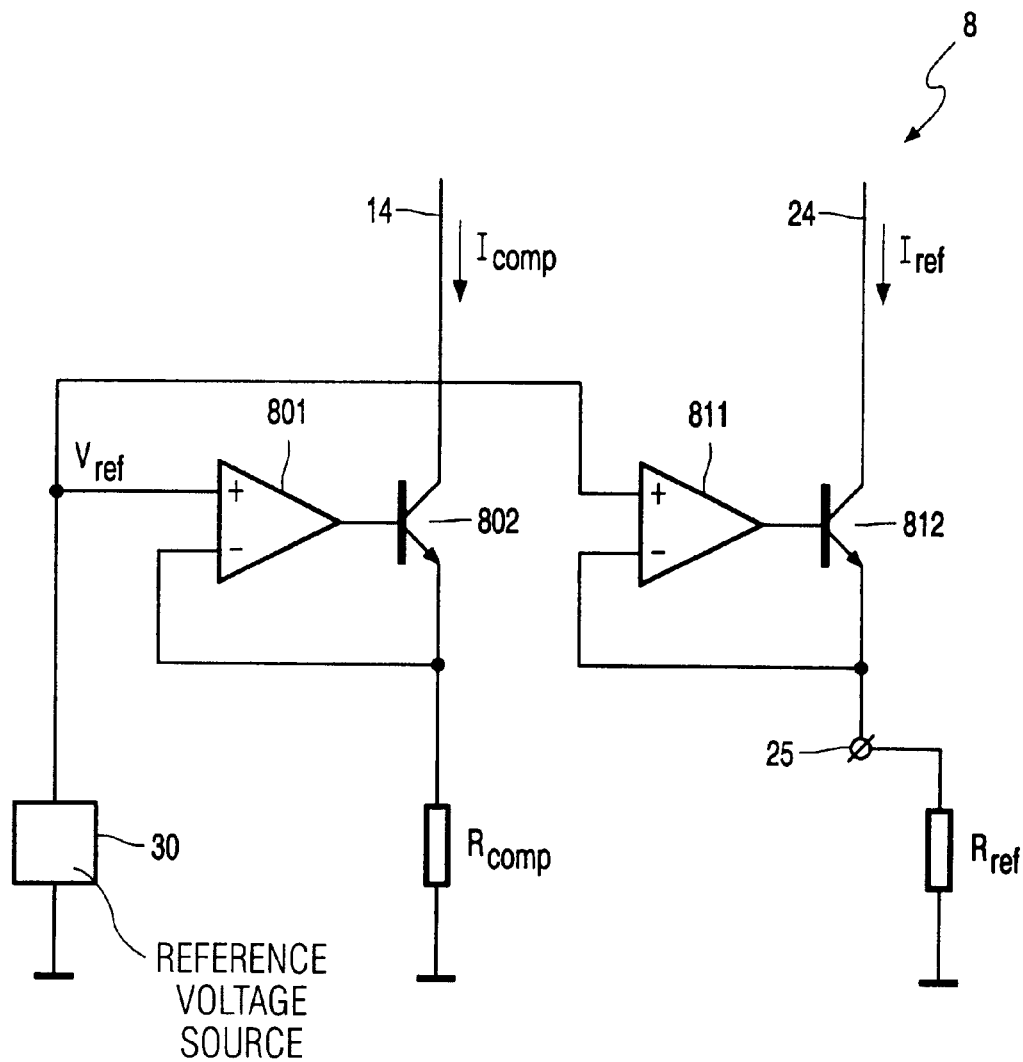

FIG. 4C illustrates a practical example of a parameter source 8 in accordance with the present invention in the interpretation as illustrated in FIG. 2C.

The parameter source 4C shown in FIG. 4C includes a first operational amplifier 801 having its output connected to the base of a first transistor 802. The first transistor 802 has its emitter connected to the inverting input of the first operational amplifier 801 and to a first end of the compensation resistor $R_{comp}$, which has its other end connected to ground. The non-inverting input of the operational amplifier 801 is connected to the reference voltage source 30 for receiving the reference voltage $V_{ref}$. The voltage across the compensation resistor $R_{comp}$ is equal to $V_{ref}$, which results in a current equal to $V_{ref}/R_{comp}$ being produced in the collector-emitter path of the first transistor 802. This current appears as the compensation current $I_{comp}$ at the compensation current output 14 connected to the collector of the first transistor 802.

Likewise, the parameter source 8 includes a second operational amplifier 811 having its output connected to the base of a second transistor 812. The second transistor 812 has its emitter connected to the inverting input of the second operational amplifier 811 and, via the terminal 25, to a first end of the reference resistor $R_{ref}$, which has its other end connected to ground. The non-inverting input of the second operational amplifier 811 is connected to the reference voltage source 30 to receive the reference voltage $V_{ref}$. The voltage across the reference resistor $R_{ref}$ is equal to $V_{ref}$, as a result of which a current equal to $V_{ref}/R_{ref}$ is produced in the collector-emitter path of the second transistor 812. Said current appears as the reference current $I_{ref}$ at the reference current output 24 connected to the collector of the second transistor 812.

As stated, the exact value of $V_{ref}$ is non-critical as long as the reference resistor $R_{ref}$ and the compensation resistor $R_{comp}$ receive the same reference voltage $V_{ref}$.

Advantageously, the primary V/I converter 3 and the function of the compensation device 7 (multiplier) described hereinbefore are integrated in a single circuit. This reduces the area required on the chip 100. Moreover, this has the advantage that the current generated in the converter can be used directly in the multiplier.

Thus, the present invention provides an arrangement 1 implemented on a chip 100, for converting a voltage $V_{in}$ into a current $I_{out}$. This arrangement includes a first V/I converter 3 whose operation is based on a conversion resistor $R_{conv}$ fabricated on the chip. This resistor has an unknown fabrication tolerance $\alpha$. This is compensated for by the presence of a second V/I converter 13 which also has an on-chip compensation resistor $R_{comp}$ having the same fabrication tolerance $\alpha$. Furthermore, there is a third V/I converter 23 whose operation is based on an external resistor $R_{ref}$. The second V/I converter 13 converts a reference voltage $V_{ref}$ into a compensation current signal $I_{comp}$, and the third V/I converter 23 converts the reference voltage $V_{ref}$ into a reference current signal $I_{ref}$. The output current $I_{out}$ is obtained by multiplying an output signal $I_1$ of the first V/I converter 3 by a factor which is directly proportional to the reference current signal $I_{ref}$ and which is inversely proportional to the compensation signal $I_{comp}$.

It will be evident to one skilled in the art that the scope of the present invention is not limited to the examples described hereinbefore but that various changes and modifications thereto are possible without departing from the scope of the invention as defined in the appended claims.

For example, the invention has been elucidated in the foregoing for the case of a voltage to current conversion. Conversely, the present invention can also be applied to a current to voltage conversion in implementations where the conversion is based on a conversion resistor.

However, the present invention is applicable more broadly in conversions of a measurement quantity into a electrical measurement signal (voltage, current, frequency etc.), where the conversion is based on characteristics of a conversion element but which characteristics cannot accurately be preset. Examples of this are a temperature sensor and a pressure sensor. In accordance with the present invention a measurement is then carried out by means of a primary sensor which includes a primary conversion element and which supplies a primary measurement signal. A secondary sensor includes a secondary conversion element, which in accordance with an important aspect of the present invention has characteristics substantially identical to those of the primary conversion element. This can be accomplished, for example, in that the secondary conversion element and the primary conversion element are fabricated in the same process steps, for example in that the secondary conversion element and the primary conversion element are accommodated on the same chip. By means of the secondary sensor a compensation measurement is carried out on a reference in order to provide a compensation signal. Furthermore, a source supplying an accurate reference signal is provided. If the primary measurement signal is multiplied by the quotient of the reference signal and the compensation signal a compensated conversion signal is obtained which is substantially independent of any variations in the characteristic of the primary conversion element caused by process variations, the result being dependent on the quantity to be measured.

Moreover, the present invention can be used in all cases where it is desirable to have a multiplier with an adjustable multiplication factor.

What is claimed is:

1. A method of converting a measurement quantity into an electrical conversion signal, comprising the steps of:

carrying out a measurement of the measurement quantity by means of a primary sensor which includes a primary conversion element and which supplies a primary electrical measurement signal;

providing a secondary sensor having a secondary conversion element which has characteristics substantially identical to those of the primary conversion element;

providing a reference quantity;

carrying out a compensation measurement on the reference quantity by means of the secondary sensor in order to provide a compensation signal;

providing an accurate reference signal;

multiplying the primary reference signal by the quotient of the reference signal and the compensation signal in order to supply the electrical conversion signal.

2. A method as claimed in claim 1, wherein the secondary conversion element and the primary conversion element are fabricated in the same process steps, for example in that the secondary conversion element and the primary conversion element are fabricated on the same chip.

3. A method of converting an input voltage ($V_{in}$) into an output current ($I_{out}$), comprising the steps of:

providing a first V/I converter (3) having a conversion resistor ($R_{conv}$);

providing a second V/I converter (13) having a compensation resistor ($R_{comp}$), the compensation resistor ($R_{comp}$) and the conversion resistor ($R_{conv}$) being fabricated so as to have similar characteristics, and preferably being fabricated in the same process steps;

providing a reference voltage ($V_{ref}$);

providing a reference current signal ($I_{ref}$);

converting the input voltage ($V_{in}$) into a first current signal ($I_1$) by means of the first V/I converter (3);

converting the reference voltage ($V_{ref}$) into a compensation current signal ($I_{comp}$) by means of the second V/I converter (13);

providing the output current ($I_{out}$) as the product of, on the one hand, the first current signal ($I_1$) and, on the other hand, the quotient of the reference current signal ($I_{ref}$) and the compensation current signal ($I_{comp}$).

4. A method as claimed in claim 3, wherein the reference current signal ($I_{ref}$) is derived from the reference voltage ($V_{ref}$) by means of a third V/I converter (23) having an external reference resistor ($R_{ref}$).

5. An arrangement (1) for the conversion of voltage ($V_{in}$) into current ($I_{out}$), having a signal input (2) for receiving an input voltage ($V_{in}$) and a signal output (5) for supplying an output current ($I_{out}$), comprising:

a first V/I converter (3) having an input coupled to said signal input (2), which first V/I converter (3) comprises a first conversion resistor ($R_{conv}$) and is adapted to supply a first current signal ($I_1$) by converting the voltage signal ($V_{in}$) received at its input on the basis of said first conversion resistor ($R_{conv}$);

the first conversion resistor ($R_{conv}$) having an unknown tolerance factor ($\alpha$);

compensation means (7; 13, 23, 40, 50) for supplying the output current ($I_{out}$) by multiplying said first current signal ($I_1$) by a factor which is proportional to an accurate reference current signal ($I_{ref}$) and which is inversely proportional to an inaccurate second current signal ($I_{comp}$).

6. An arrangement as claimed in claim 5, wherein said compensation means (7; 13, 23, 40, 50) comprise:

a second V/I converter which comprises a second conversion resistor ($R_{comp}$), which second conversion resistor ($R_{comp}$) has a tolerance factor ($\alpha$) which is unknown but which is substantially equal to the tolerance factor ($\alpha$) of the first conversion resistor ($R_{conv}$);

means (30) for supplying a first reference voltage ($V_{ref}$) to an input (12) of the second V/I converter (13);

the second V/I converter (13) being adapted to supply the second current signal ($I_{comp}$) by converting the first reference voltage ($V_{ref}$) on the basis of said second conversion resistor ($R_{comp}$).

7. An arrangement as claimed in claim 6, wherein the second V/I converter (13) includes a plurality of compensation resistors ($R_{comp}$) and controllable switches associated therewith.

8. An arrangement as claimed in claim 6, wherein said compensation means (7; 13, 23, 40, 50) comprise:

a third V/I converter (23) having an input terminal (25) for the connection thereto of an external reference resistor ($R_{ref}$);

means (30) for supplying a second reference voltage ($V_{ref}$) to an input (22) of the third V/I converter (23);

the third V/I converter (23) being adapted to supply the reference current signal ($I_{ref}$) by conversion of the second reference voltage ($V_{ref}$) on the basis of said external reference resistor ($R_{ref}$).

9. An arrangement as claimed in claim 8, including a common voltage source (30) for supplying the first and the second reference voltage ($V_{ref}$).

10. An arrangement as claimed in claim 6, wherein the first V/I converter (3) and the second V/I converter (13) have been formed on a single chip (100).

11. An arrangement as claimed in claim 10, wherein said compensation means (7; 13, 23, 40, 50) have been formed on the same chip (100).

12. An arrangement as claimed in claim 11, wherein the same chip (100) includes:

a plurality of first V/I converters (3(1-N));

a plurality of compensation means (7(1-N)), each associated with a respective first V/I converter (3(1-N));

wherein means (23) for supplying the accurate reference current signal ($I_{ref}$) are common to a multiplicity of the compensations means (7(1-N), and are preferably common to all compensation means (7(1-N)).

13. An arrangement as claimed in claim 5, wherein the conversion function of the first V/I converter (3) and the compensation function of the compensation means (7) are implemented in a single circuit.

14. An arrangement as claimed in claim 5, wherein the first V/I converter (3) comprises:

two input terminals (2a, 2b);

two output terminal (4a, 4b);

two transistors (302a, 302b) having their respective collectors connected to the output terminals (4a, 4b);

two operational amplifiers (301a, 301b) having their respective non-inverting inputs connected to the input terminals (2a, 2b) and having their respective outputs connected to the bases of the respective transistors, and having their respective inverting inputs connected to the emitters of the respective transistors;

wherein the emitters of the transistors (302a, 302b) are respectively connected to respective ends of the conversion resistor ($R_{conv}$); and wherein the emitters of the transistors (302a, 302b) are respectively connected to respective current sources (303a, 303b), which are each adapted to generate a bias current ($I_{bias}$).

15. An arrangement as claimed in claim 5, wherein the compensation device (7) comprises:

a first transistor (701) having a collector coupled to a current input (41; 41a, 41b), and having an emitter connected to ground;

a second transistor (702) having an emitter connected to the base of the first transistor (701) and to a reference current input (52);

a third transistor (703) having a base connected to the base of the second transistor (702) and having an emitter connected to a compensation current input (42);

a fourth transistor (704) having a base connected to the emitter of the third transistor (703), having an emitter connected to ground, and having a collector connected to a current output (53; 53a, 53b).

16. An arrangement as claimed in claim 5, wherein the compensation device (7) includes a parameter source (8) comprising:

a first operational amplifier (801) having a non-inverting input connected to a reference voltage source (30);

a first transistor (802) having a base connected to the output of the first operational amplifier (801), having an emitter connected to the inverting input of the first operational amplifier (801), and having a collector connected to a compensation current output (14);

a compensation resistor ($R_{comp}$) having its one end connected to the emitter of the first transistor (802) and having its other end connected to ground;

a second operational amplifier (811) having a non-inverting input connected to the reference voltage source (30);

a second transistor (812) having a base connected to the output of the second operational amplifier (811), having an emitter connected to the inverting input of the second operational amplifier (811) and to a resistor input terminal (25), and having a collector connected to a reference current output (24).

* * * * *